United States Patent [19]

Nakajima et al.

[11] Patent Number: 4,609,933
[45] Date of Patent: Sep. 2, 1986

[54] GATE TURN-OFF THYRISTOR HAVING P+ GATE AND EMITTER

[75] Inventors: Toshihiro Nakajima; Yoshiaki Hisamoto; Kozo Yamagami, all of Itami, Japan

[73] Assignee: Mitsubishi Denki Kabushiki Kaisha, Tokyo, Japan

[21] Appl. No.: 662,080

[22] Filed: Oct. 18, 1984

[30] Foreign Application Priority Data

Nov. 30, 1983 [JP] Japan ............... 58-228042

[51] Int. Cl.⁴ ............... H01L 29/74; H01L 29/06
[52] U.S. Cl. ............... 357/38; 357/91; 357/55
[58] Field of Search ............... 357/38, 38 G

[56] References Cited

U.S. PATENT DOCUMENTS 4,484,214 11/1984 Misawa et al. ............... 357/38
4,511,913 4/1985 Nagano ............... 357/38

FOREIGN PATENT DOCUMENTS 0008535 3/1980 European Pat. Off. .......... 357/38 G
57-4101 1/1982 Japan .
57-78172 5/1982 Japan ............... 357/38 G Primary Examiner—Andrew J. James
Assistant Examiner—R. Limanek
Attorney, Agent, or Firm—Lowe Price Leblanc Becker & Shur

[57] ABSTRACT

A gate turn-off thyristor including N-type emitter regions (4) formed in part in the surface layer of a P-type base layer (3), and P+ layer regions (10) of a high impurity concentration formed immediately beneath gate electrodes (8) in the P-type base layer (3) and immediately beneath the periphery of the N-type emitter regions (4), such that the depth of the P+ layer regions immediately beneath the gate electrodes (8) is selected to be deeper than the N-type emitter regions (4).

11 Claims, 9 Drawing Figures

GATE TURN-OFF THYRISTOR HAVING P+ GATE AND EMITTER

BACKGROUND OF THE INVENTION

1. Field of the Invention

The present invention relates to a gate turn-off thyristor. More specifically, the present invention relates to a gate turn-off thyristor capable of interrupting a large anode current in a short period of time.

2. Description of the Prior Art

A gate turn-off thyristor has been proposed and put into practical use as a semiconductor device capable of performing a switching function, i.e. capable of turning on or off a current in response to a gate signal. Of late, such gate turn-off thyristors came to be highlighted as a new power semiconductor device and such a device that can turn off an anode current as large as 2500A has been developed.

FIG. 1 is a sectional view showing one example of a layered structure of a conventional gate turn-off thyristor. The gate turn-off thyristor comprises a four-layered structure having a P-type emitter layer 1, an N-type base layer 2, a P-type base layer 3 and an N-type emitter layer 4, formed in succession on one another from the lowermost layer. However, the N-type emitter layer 4 is divided into a plurality of regions in a planar manner and the surface of the P-type base layer 3 is formed with P+ layer regions 5 for providing ohmic contact. An anode electrode 6 is formed on the surface of the P-type emitter layer 1 and cathode electrodes 7 are formed on the surface of the N-type emitter layer and then gate electrodes 8 are formed on the surface of the P+ layer regions of the P-type base for controlling current.

FIG. 2 is an enlarged view showing the current flowing through the P-type base layer 3 while the gate turn-off thyristor shown in FIG. 1 is being turned off, wherein the current flows along the arrow lines.

FIG. 3 is a graph showing mutual relation of the respective time dependent changes of interruption anode current ($I_{TGQ}$), forward voltage ($V_D$) and gate current $I_{GQ}$) of the gate turn-off thyristor. In the figure, the ordinate indicates the current or the voltage and the abscissa indicates the time, wherein $t_{gq}$ corresponds to a turn-off time. The anode current flows to the gate electrodes 8, as shown in FIG. 2, on the occasion of the interruption, and thus the carriers in the P-type base layer 3 are gradually extracted with the current to the gate electrode, thereby to narrow the region in a conduction state, so that the thyristor may be turned off ultimately. However, while the anode current is being turned off, the current is concentrated in the gradually narrowed region in a conduction state, with the result that thermal destruction or the like could occur in the narrowed region in a conduction state. Hence, it is desired that an approach is considered to extract efficiently and quickly the carriers in the above described P-type base layer 3. To that end, approaches can be thought of wherein the width L of every N-type emitter layer region is made narrow or the impurity concentration of the P-type base layer 3 is increased as much as possible. Although an ordinary gate turn-off thyristor is structured such that the width L of every N-type emitter layer region 4 is selected to be as narrow as several 100 μm, it is necessary that the width L is selected to be much narrower in a case where a larger anode current is to be gate turned off. However, when the width L of the N-type emitter layer region 4 is selected to be narrower, problems arise in that the cathode area is decreased, the manufacture becomes difficult, the yield rate is decreased and the like. When the impurity concentration of the whole P-type base layer 3 is increased, injection efficiency of the carriers from the N-type emitter layer region 4 to the P-type base layer 3 is gradually decreased, whereby a current amplification factor $\alpha_{NPN}$ of an NPN transistor comprised of the N-type emitter layer region 4, the P-type base layer 3, and the N-type base layer 2 is decreased as the impurity concentration of the P-type base layer 3 is increased.

Meanwhile, as is well known, in order that a gate turn-off thyristor may be turned on from a forward directional block state, the sum of the above described current amplification factor $\alpha_{NPN}$ of the NPN transistor and the current amplification factor $\alpha_{PNP}$ of the PNP transistor comprised of the P-type base layer 3, the N-type base layer 2 and the P-type emitter layer 1 need be larger than the unity. If the impurity concentration of the P-type base layer 3 is increased too much, the above described conditions come not to be met, with the result that the gate turn-off thyristor does not perform a function of turn on. Accordingly, the impurity concentration of the P-type base layer 3 cannot be increased more than a certain value.

Since a conventional gate turn-off thyristor was structured in the above described manner, disadvantages were involved that the turn off time period is so long that the thyristor cannot be used as a high frequency inverter while an interruption anode current is small.

SUMMARY OF THE INVENTION

The present invention was made to eliminate the above described disadvantages involved in a conventional gate turn-off thyristor.

Briefly, the present invention comprises a gate turn-off thyristor including an emitter layer of one conductivity type, a base layer of the opposite conductivity type and a base layer of said one conductivity type, formed in succession, an emitter layer region of said opposite conductivity type formed in the surface layer of the base layer of said one conductivity type, one electrode, another electrode, and a gate electrode formed on the surfaces of the emitter layer of said one conductivity type, the emitter layer region of said opposite conductivity type, and the base layer of said one conductivity type, respectively, a gate signal being applied to the gate electrode so that current between said one and said other electrodes may be turned on or off, characterized in that a layer of a high impurity concentration of said one conductivity type is formed in the base layer of said one conductivity type beneath the gate electrode and beneath the peripheral portions of the emitter layer regions of said opposite conductivity type and the depth of the layer of the high impurity concentration of said one conductivity type is selected to be deeper than the emitter layer regions of said opposite conductivity type and is shallower than the base layer of said one conductivity type.

According to the present invention, a gate turn-off thyristor is provided in which larger anode current can be interrupted within a short period of time as compared with a conventional gate turn-off thyristor.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
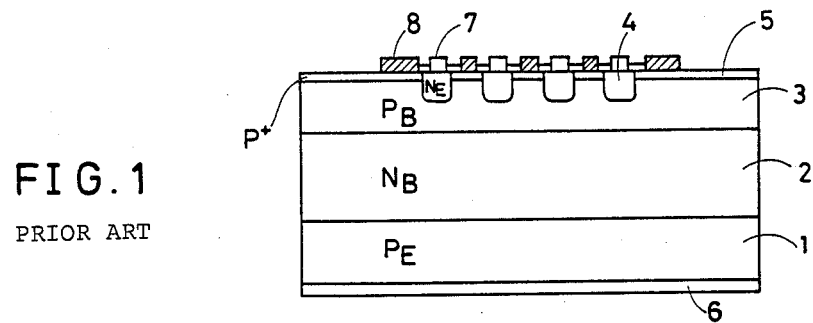
FIG. 1 is a sectional view showing a layered structure of a conventional gate turn-off thyristor.
Figure 2:
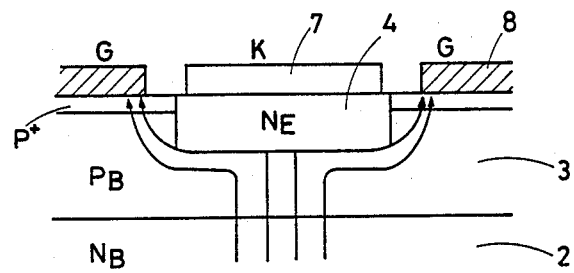
FIG. 2 is a view showing the flow of carriers of the anode current while the conventional gate turn-off thyristor is being turned off.
Figure 3:
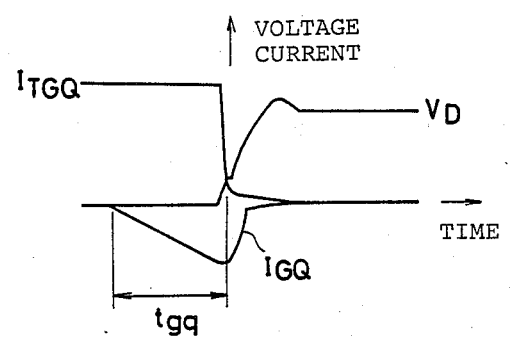
FIG. 3 is a graph showing the changes of the voltage and the current while the conventional gate turn-off thyristor is being turned off.
Figure 4:
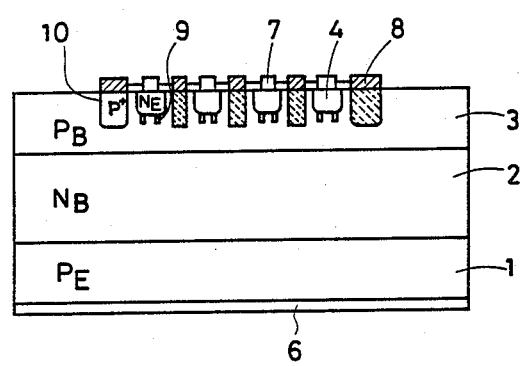
FIG. 4 is a sectional view showing a layered structure of a gate turn-off thyristor in accordance with an embodiment of the present invention.

FIG. 4 is a sectional view showing a layered structure of an embodiment of the present invention. The fundamental structure of the embodiment shown in FIG. 4 is almost the same as that shown in FIG. 1 and comprises a silicon wafer of a usual impurity concentration to be an N-type base layer 2, which undergoes diffusion of a Group III impurity (such as Al, Ga, B or the like) on both surfaces thereof, whereby a P-type emitter layer 1 and a P-type base layer 3 are formed on both surfaces of the silicon wafer. Then an impurity of the Group III (B) is diffused onto one surface of the silicon wafer, as shown, to the concentration higher than that of the P-type base layer 1. In other words, a P+ layer is formed in regions 9 beneath the lower peripheral portions of the N-type emitter layer regions 4 to be formed subsequently and in regions 10 beneath the gate electrodes 8 to be formed subsequently such that the P+ layer may be deeper than the N-type emitter layer 4 and shallower than the P-type base layer 3. Then an impurity of the Group V (P) is diffused such that the above described N-type emitter layer regions 4 may be formed. Then an anode electrode 6, cathode electrodes 7 and gate electrodes 8 are formed on the surfaces of the P-type emitter layer 1, the N-type emitter layer regions 4 and the P+ regions 10 of the P-type base region 3. The inventive gate turn-off thyristor thus structured has a structure wherein the P+ layer has been removed in the lower central portion of every N-type emitter layer region 4, thereby to attain an appropriate $\alpha_{NPN}$. By properly selecting the impurity concentrations of the P+ layer regions 9 and 10, a gate turn-off thyristor of excellent turn-on and turn-off characteristics (particularly a turn-off characteristic) is obtained.

Figure 5:
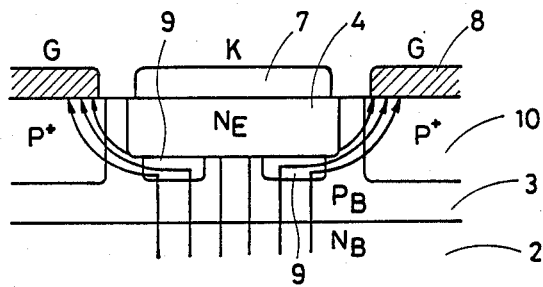
FIG. 5 is a view showing the flow of the carriers of the anode current while the gate turn-off thyristor of the embodiment shown in FIG. 4 is being turned off.

Referring to FIG. 5, the operation of the above described gate turn-off thyristor will be described. Referring to FIG. 5, when a negative pulse is applied to the gate electrodes 8, the anode current flows between the anode electrode 6 and the gate electrodes 8, and then the carriers of the anode current are quickly extracted to the gate electrode 8 through the low resistance portions 9 and 10 of the P+ layers. The carriers stored in the P-type base layer 3 are also quickly extracted to the gate electrode 8 through the low resistance portions 9 and 10. By virtue of the above described operation, the turn-off time can be drastically reduced to about 8 μs from conventional 15 μs.

In the foregoing, a gate turn off thyristor of a type having a gate electrode formed on a P-type base layer was described; however, it is pointed out that the present invention can be equally applicable to a gate turn-off thyristor of a structure in which the relation of the P-type and N-type is reversed.

Figure 6:
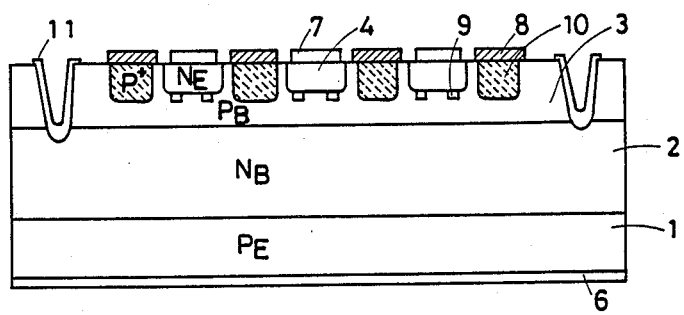
FIG. 6 is a sectional view showing a layered structure of another embodiment of the inventive gate turn-off thyristor provided with a glass passivation.

The above described embodiment was of a mesa type; however, this should be taken merely by way of an example and is not to be taken by way of limitation, inasmuch as the present invention can be also applied to a glass passivation type, as shown in FIG. 6, for example. More specifically, referring to FIG. 6 as well as FIG. 4, wherein the same reference characters denote the same or like portions, a glass passivation 11 is provided in the embodiment shown in FIG. 6.

Figure 7:
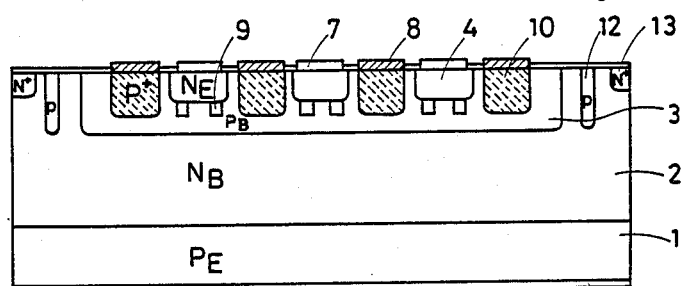
FIG. 7 is a sectional view showing a layered structure of a further embodiment of the inventive gate turn-off thyristor employed in a planar type with a guard ring and a channel cut.

The present invention can be also applied to a planar type as shown in FIG. 7. Referring to FIG. 7 as well as FIG. 4, wherein the same reference characters denote the same or like portions, a P guard ring 12 and an N+ channel cut 13 are provided in the embodiment shown in FIG. 7.

Figure 8:
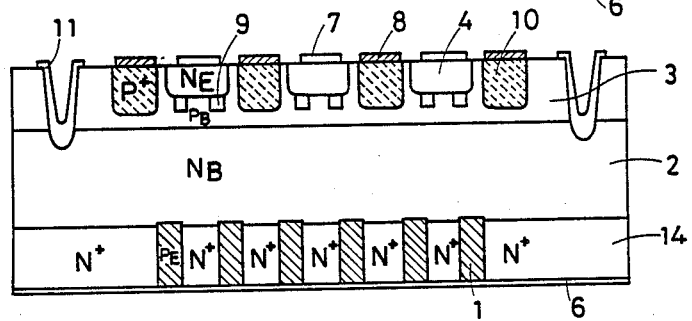
FIG. 8 is a sectional view of a layered structure of a further embodiment of the inventive gate turn-off thyristor embodied in an anode short type.

The present invention can be also applied to an anode short type as shown in FIG. 8. More specifically, referring to FIG. 8 as well as FIG. 4, wherein the same reference characters denote the same or like portions, N+ layer regions 14 of an anode short type are formed in the embodiment shown in FIG. 8.

Figure 9:
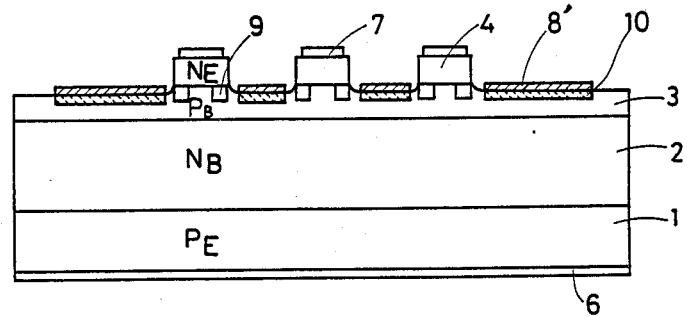
FIG. 9 is a sectional view showing a layered structure of a further embodiment of the inventive gate turn-off thyristor embodied in a gate etching down type.

The present invention can be also applied to a gate etching down type as shown in FIG. 9. More specifically, referring to FIG. 9 as well as FIG. 4, wherein the same reference characters denote the same and like portions, the gate regions 8' in the P-type base layer 3 are etched down to the level lower than the N-type emitter layer 4.

It is further pointed out that in any of these other embodiments the relation of the P-type and N-type may be reversed as compared with that of the embodiment shown in FIG. 4. Any other various modifications can be made, without departing the scope and spirit of the present invention and performing the same function as that of the embodiment shown in FIG. 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a gate turn-off thyristor comprising an emitter layer (1) of one conductivity type, a base layer (2) of the opposite conductivity type formed on said emitter layer (1) of said one conductivity type, a base layer (3) of said one conductivity type formed on said base layer (2) of said opposite conductivity type, an emitter region (4) of said opposite conductivity type formed on a part of the surface layer of said base layer (3) of said one conductivity type, one electrode (6) formed on the surface of said emitter layer (1) of said one conductivity type, another electrode (7) formed on the surface of said emitter region (4) of said opposite conductivity type, and a gate electrode (8) on the surface of said base layer (3) of said one conductivity type, the improvement wherein

- layer regions (10, 9) of a high impurity concentration of said one conductivity type in said base layer (3) of said one conductivity type are formed immediately beneath said gate electrode (8) in direct contact therewith and immediately beneath the peripheral portions of said emitter region (4) of said opposite conductivity type in direct contact therewith, and
- the depth of every layer region (10, 9) of said high impurity concentration of said one conductivity type is selected to be deeper than said emitter region (4) of said opposite conductivity type and shallower than said base layer (3) of said one conductivity type.

2. A gate turn-off thyristor in accordance with claim 1, wherein a glass passivation (11) is provided.

3. A gate turn-off thyristor in accordance with claim 1, wherein
- said base layer (3) of said one conductivity type is formed on part of the surface layer of said base layer (2) of said opposite conductivity type,
- a guard ring (12) of a high impurity concentration of said one conductivity type is formed to surround said base layer region (3) of said one conductivity type, and a channel cut (13) of a high impurity concentration of said opposite conductivity type is provided outside said guard ring layer (12).

4. A gate turn-off thyristor in accordance with claim 1, wherein short layer regions (14) of a high impurity concentration of said opposite conductivity type are provided in said emitter layer (1) of said one conductivity type.

5. A gate turn-off thyristor in accordance with claim 1, wherein gate regions (8') in said base layer of said one conductivity type are etched down.

6. A gate turn-off thyristor in accordance with claim 1, wherein said one type is a P-type and said opposite type is an N-type.

7. A gate turn-off thyristor in accordance with claim 6, wherein said one type is an N-type and said opposite type is a P-type.

8. A gate turn-off thyristor in accordance with claim 1 wherein said emitter region (4) is formed at its peripheral regions on said layer regions of said high impurity concentration of said one conductivity type and in the region between said peripheral portions on said base layer of said one conductivity type.

9. In a gate turn-off thyristor comprising an emitter layer (1) of one conductivity type, a base layer (2) of the opposite conductivity type formed on said emitter layer (1) of said one conductivity type, a base layer (3) of said one conductivity type formed on said base layer (2) of said opposite conductivity type, an emitter region (4) of said opposite conductivity type formed on a part of the surface layer of said base layer (3) of said one conductivity type, one electrode (6) formed on the surface of said emitter layer (1) of said one conductivity type, another electrode (7) formed on the surface of said emitter region (4) of said opposite conductivity type, and a gate electrode (8) on the surface of said base layer (3) of said one conductivity type, the improvement wherein

- layer regions (10, 9) of a high impurity concentration of said one conductivity type in said base layer (3) of said one conductivity type are formed beneath said gate electrode (8) in direct contact therewith and beneath the peripheral portions of said emitter region (4) of said opposite conductivity type and in direct contact therewith, and
- the depth of every layer region (10, 9) of said high impurity concentration of said one conductivity type is selected to be deeper than said emitter region (4) of said opposite conductivity type and shallower than said base layer (3) of said one conductivity type.

10. A gate turn-off thyristor as recited in claim 9 wherein said layer regions of a high impurity concentration are formed beneath said gate electrode and beneath only the peripheral portions of said emitter region.

11. A gate turn-off thyristor as recited in claim 1 wherein said layer regions of a high impurity concentration are formed beneath said gate electrode and beneath only the peripheral portions of said emitter region.

* * * * *